(12) United States Patent
Arnold et al.

(10) Patent No.: US 11,404,317 B2
(45) Date of Patent: Aug. 2, 2022

(54) METHOD FOR FABRICATING A SEMICONDUCTOR DEVICE INCLUDING SELF-ALIGNED TOP VIA FORMATION AT LINE ENDS

(71) Applicant: INTERNATIONAL BUSINESS MACHINES CORPORATION, Armonk, NY (US)

(72) Inventors: John C. Arnold, North Chatham, NY (US); Ashim Dutta, Menands, NY (US); Dominik Metzler, Saratoga Springs, NY (US); Ekmini A. De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 174 days.

(21) Appl. No.: 16/580,567

(22) Filed: Sep. 24, 2019

(65) Prior Publication Data

US 2021/0090951 A1    Mar. 25, 2021

(51) Int. Cl.
*H01L 21/768* (2006.01)
*H01L 21/033* (2006.01)
*H01L 23/522* (2006.01)

(52) U.S. Cl.
CPC .... *H01L 21/76897* (2013.01); *H01L 21/0335* (2013.01); *H01L 21/0337* (2013.01); *H01L 21/0338* (2013.01); *H01L 23/5226* (2013.01)

(58) Field of Classification Search
CPC ........... H01L 21/76897; H01L 21/0335; H01L 21/0338; H01L 21/0337; H01L 21/76885; H01L 23/5226

(Continued)

(56) References Cited

U.S. PATENT DOCUMENTS 6,045,678 A * 4/2000 Morse ...................... C25D 7/12
445/50
7,025,892 B1 * 4/2006 Bergeron ................ H01J 3/022
216/13

(Continued)

FOREIGN PATENT DOCUMENTS

| CN | 104810325 A | 7/2015 |
| CN | 110047831 A | 7/2019 |
| WO | 2018063323 A1 | 4/2018 |

OTHER PUBLICATIONS

Paolillo, "Direct Metal Etch of Ruthenium for Advanced Interconnect", Journal of Vacuum Science and Technology B: Nanotechnology and Microelectronics; vol. 36, Issue 3, May 2018, 10 pages.
International Search Report issued in International Application No. PCT/IB2020/057794, dated Nov. 26, 2020, pp. 1-9.

*Primary Examiner* — Khiem D Nguyen
(74) *Attorney, Agent, or Firm* — Tutunjian & Bitetto, P.C.; Abdy Raissinia

(57) ABSTRACT

A method for fabricating a semiconductor device includes recessing a first odd hardmask and a first even hardmask to form recessed odd and even hardmasks, forming a first conductive hardmask including first conductive hardmask material on the recessed odd hardmask and a second conductive hardmask on the recessed even hardmask, and forming self-aligned vias at line ends corresponding to the first odd and even conductive lines based at least in part on the first and second conductive hardmasks.

24 Claims, 9 Drawing Sheets

(58) Field of Classification Search
USPC .......................................................... 257/758
See application file for complete search history.

(56) References Cited

U.S. PATENT DOCUMENTS

| | | | |
|---|---|---|---|
| 8,722,532 B2 | 5/2014 | Usami et al. | |
| 8,918,746 B1 | 12/2014 | Yuan et al. | |
| 9,117,888 B2 | 8/2015 | Sudo | |
| 9,391,019 B2 | 7/2016 | Kobrinsky et al. | |
| 9,437,657 B2* | 9/2016 | Shepard | H01L 27/2409 |
| 9,679,805 B2 | 6/2017 | Bouche et al. | |
| 9,812,396 B1 | 11/2017 | Stephens et al. | |
| 10,204,856 B2* | 2/2019 | Edelstein | H01L 23/528 |
| 2004/0262256 A1 | 12/2004 | Gambino et al. | |
| 2005/0196922 A1 | 9/2005 | Wilier | |
| 2008/0160759 A1* | 7/2008 | Lee | H01L 21/31144 |
| | | | 438/672 |
| 2010/0164111 A1* | 7/2010 | Yang | H01L 21/76814 |
| | | | 257/E23.141 |
| 2013/0260562 A1* | 10/2013 | Park | H01L 21/308 |
| | | | 438/702 |
| 2016/0197011 A1* | 7/2016 | Bristol | H01L 21/76897 |
| | | | 257/760 |
| 2018/0061750 A1* | 3/2018 | Briggs | H01L 21/76883 |
| 2018/0269144 A1* | 9/2018 | Briggs | H01L 21/76829 |
| 2018/0323104 A1* | 11/2018 | Younkin | H01L 21/0274 |
| 2019/0013202 A1* | 1/2019 | Thompson | C23F 1/00 |

* cited by examiner

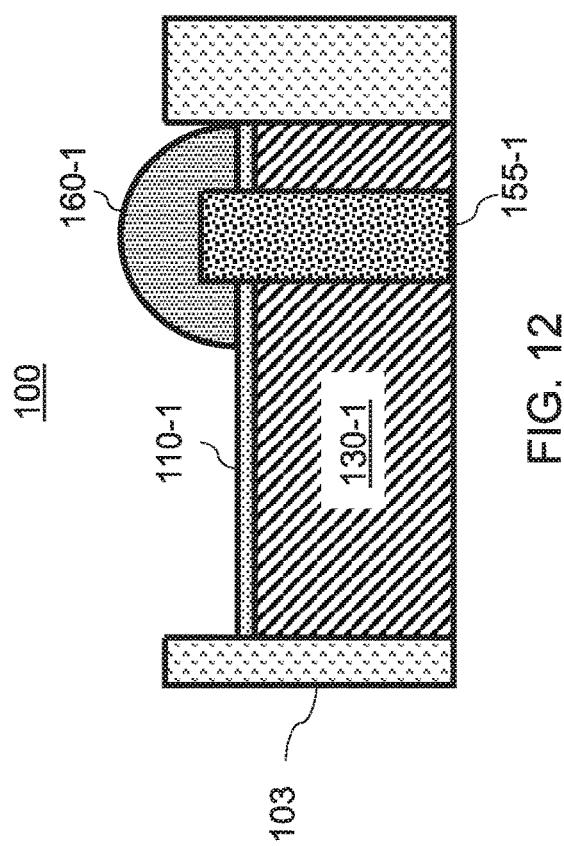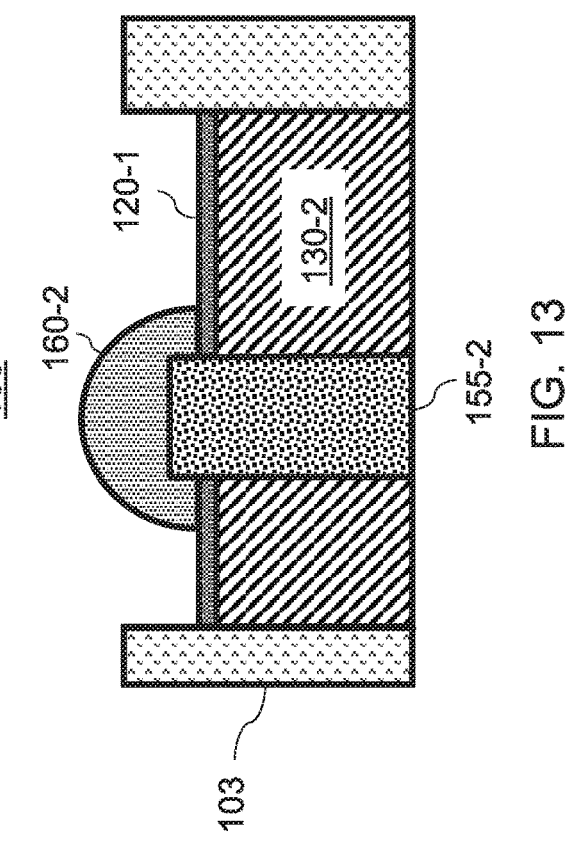

METHOD FOR FABRICATING A SEMICONDUCTOR DEVICE INCLUDING SELF-ALIGNED TOP VIA FORMATION AT LINE ENDS

BACKGROUND

The present invention generally relates to semiconductor devices, and more particularly to semiconductor devices including conductive lines and vias and methods of forming the same.

Lithographic alignment of vias and conductive lines can occur through thick, opaque conductive films (e.g., metal films). At small dimensions, overlay and alignment errors can have a large impact on via contact resistance and dielectric barriers. Critical dimension (CD) variation can introduce additional overlay and alignment fluctuation. Finite overlay shift can cause the via to either move away from the line end or cut-off by the line end, thereby resulting in via CD reduction.

SUMMARY

In accordance with an embodiment of the present invention, a method for fabricating a semiconductor device is provided. The method includes recessing a first odd hardmask and a first even hardmask to form recessed odd and even hardmasks, forming a first conductive hardmask including first conductive hardmask material on the recessed odd hardmask and a second conductive hardmask on the recessed even hardmask, and forming self-aligned top vias at line ends corresponding to the first odd and even conductive lines based at least in part on the first and second conductive hardmasks.

In accordance with another embodiment of the present invention, a method for fabricating a semiconductor device is provided. The method includes recessing a first odd hardmask and a first even hardmask to form recessed odd and even hardmasks. The first odd hardmask is formed to include a different material from the first even hardmask to support a selective etch of the first odd and even hardmasks. The method further includes forming a first conductive hardmask including first conductive hardmask material on the recessed odd hardmask and a second conductive hardmask on the recessed even hardmask. The first and second conductive hardmasks are formed to have a semicircle cross-sectional shape along a direction of the first odd and even conductive lines. The method further includes forming self-aligned top vias at line ends corresponding to the first odd and even conductive lines based at least in part on the first and second conductive hardmasks.

In accordance with yet another embodiment of the present invention, a method for fabricating a semiconductor device is provided. The method includes forming a first odd hardmask on a first odd conductive line and a first even hardmask on a first even conductive line. The first odd hardmask is formed to include a different material from the first even hardmask to support a selective etch of the first odd and even hardmasks. The method further includes forming first dielectric layers on sidewalls of the first odd and even hardmasks and first odd and event conductive lines, forming a first cut region corresponding to the first even conductive line and forming a second cut region corresponding to the first odd conductive line, forming a first sacrificial layer within the first cut region and a second sacrificial layer within the second cut region, recessing the first odd hardmask and the first even hardmask to form recessed odd and even hardmasks, replacing the first dielectric layers with respective replacement layers, and forming a first conductive hardmask including first conductive hardmask material on the recessed odd hardmask and a second conductive hardmask on the recessed even hardmask. The first and second conductive hardmasks are formed to have a semicircle cross-sectional shape along a direction of the first odd and even conductive lines. The method further includes forming additional hardmask material on the recessed odd and even hardmasks and the first and second conductive hardmasks, performing a planarization process after forming the additional hardmask material, forming third and fourth conductive hardmasks based on non-line-end via patterning after the planarization process, forming self-aligned top vias at line ends corresponding to the first odd and even conductive lines based at least in part on the first and second conductive hardmasks, and performing additional processing. Performing additional processing includes removing the first and second sacrificial layers to form openings between the self-aligned top vias, forming second dielectric layers in the openings, and replacing the replacement layers with third dielectric layers.

In accordance with an embodiment of the present invention, a semiconductor device is provided. The device includes at least one odd conductive line and at least one even conductive line, self-aligned top vias each at a line end corresponding to the odd and even conductive lines, and dielectric layers each disposed between adjacent ones of the self-aligned top vias.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 12 is a cross-sectional view of formation of a conductive hardmask on the material formed within the first cut region, in accordance with an embodiment of the present invention;

FIG. 13 is a cross-sectional view of the formation of a conductive hardmask on the material formed within the second cut region, in accordance with an embodiment of the present invention;

DETAILED DESCRIPTION

Figure 1:
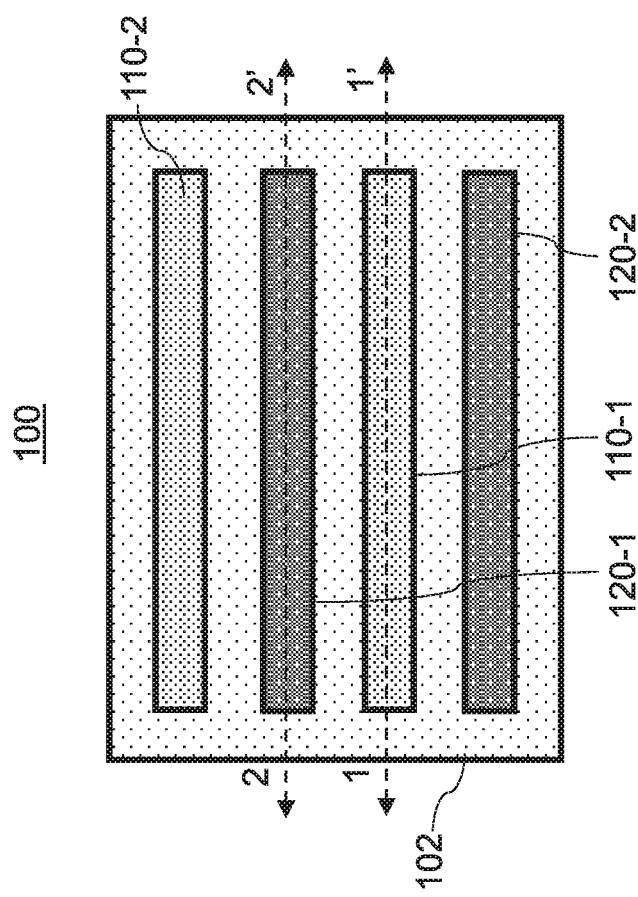
FIG. 1 is a top-down view of the formation of hardmasks on conductive lines during the fabrication of a semiconductor device, in accordance with an embodiment of the present invention.

The embodiments described herein provide for the formation of self-aligned top vias or up vias at conductive line ends. More specifically, a cut mask can be used to define a conductive line cut, and selective deposition can be used to form the self-aligned top vias on both sides of the cut corresponding to the conductive line ends. The via critical dimension (CD) at the conductive line end can be controlled by the selective deposition coverage along the direction of the conductive line. As a result, no via CD variation is introduced that would otherwise arise from lithographically aligning the via to a previously formed conductive line cut.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top-down view of a semiconductor device 100 is provided. As shown, the device 100 includes dielectric layers 102. The dielectric layers 102 can include any suitable dielectric material in accordance with the embodiments described herein. For example, the lower dielectric layer can include, e.g., silicon dioxide ($SiO_2$), low-k dielectrics, nitride layers, and combinations thereof. In one embodiment, the dielectric layers 102 can include an ultra low-k dielectric (ULK) material. For example, the dielectric layers 102 can include a dielectric material having a dielectric constant, k, less than or equal to, e.g., about 2.5.

As further shown, a plurality of hardmasks are formed on a plurality of conductive lines. More specifically, "odd" hardmasks 110-1 and 110-2 are formed on "odd" conductive lines within odd conductive line regions (not shown), and "even" hardmasks 120-1 and 120-2 are formed on "even" conductive lines within even conductive line regions (not shown).

The odd hardmasks 110-1 and 110-2 include a different material from the even hardmasks 120-1 and 120-2. More specifically, as will be described in further detail below, the material of the hardmasks can be chosen to support a selective etch of the hardmasks during processing. Additionally, the odd hardmasks 110-1 and 110-2 can include the same or different materials, and the even hardmasks 120-1 and 120-2 can include the same or different materials.

Examples of suitable materials used to form the odd hardmasks 110-1 and 110-2 can include a silicon nitride material (e.g., SiN), a silicon carbide material (e.g., SiC), etc. Examples of suitable materials used to form the even hardmasks 120-1 and 120-2 can include, but are not limited to, a silicon oxide material ($SiO_x$), a spin-on-glass (SOG) material, etc. However, the odd hardmasks and the even hardmasks can include any suitable materials in accordance with the embodiments described herein.

Figure 3:
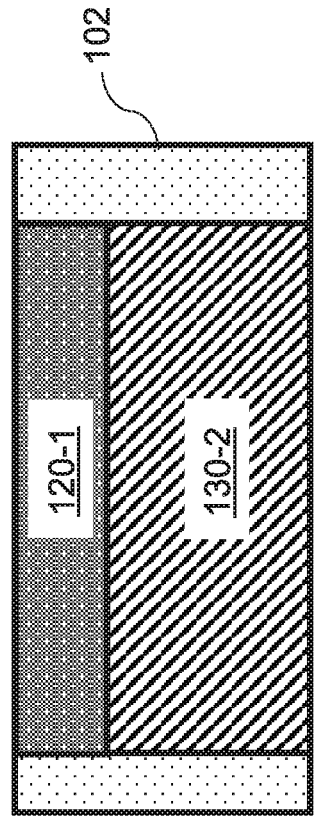
FIG. 3 is a cross-sectional view through an even conductive line of an even conductive line region of the device shown in FIG. 1, in accordance with an embodiment of the present invention.
Figure 2:
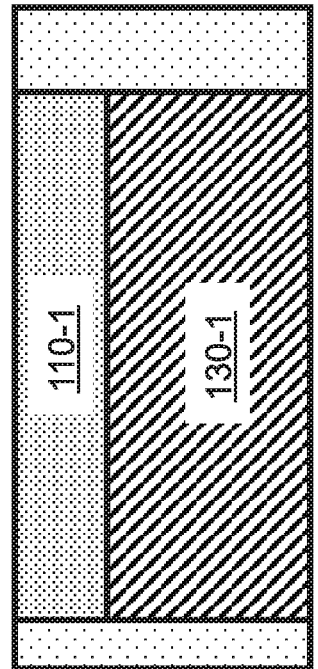
FIG. 2 is a cross-sectional view through an odd conductive line of an odd conductive line region of the device shown in FIG. 1, in accordance with an embodiment of the present invention.

With reference to FIG. 2, a cross-sectional view of the device 100 through line 1-1' of FIG. 1 is provided corresponding to a cross-section through one of the odd conductive line regions, and with reference to FIG. 3, a cross-sectional view of the device 100 through line 2-2' of FIG. 1 is provided corresponding to a cross-section through one of the even conductive line regions.

As shown in FIG. 2, the device 100 includes an odd conductive line 130-1, and the odd hardmask 110-1 formed on the odd conductive line 130-1. As shown in FIG. 3, the device 100 includes an even conductive line 130-2, and the even hardmask 120-1 formed on the even conductive line 130-2. The dielectric layers 102 are formed along the sidewalls of the conductive lines 130-1 and 130-2 and the hardmasks 110-1 and 120-1. Examples of suitable conductive materials that can be used to form the conductive lines 130-1 and 130-2 include, but are not limited to, copper (Cu), tungsten (W), ruthenium (Ru), cobalt (Co), aluminum (Al), etc.

Figure 4:
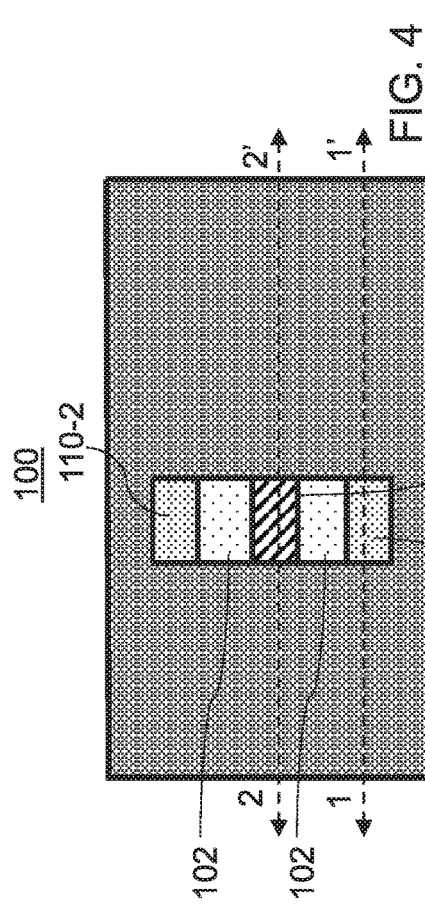
FIG. 4 is a top-down view of the formation of a first cut region corresponding to the even conductive line during the fabrication of the semiconductor device, in accordance with an embodiment of the present invention.
Figure 6:
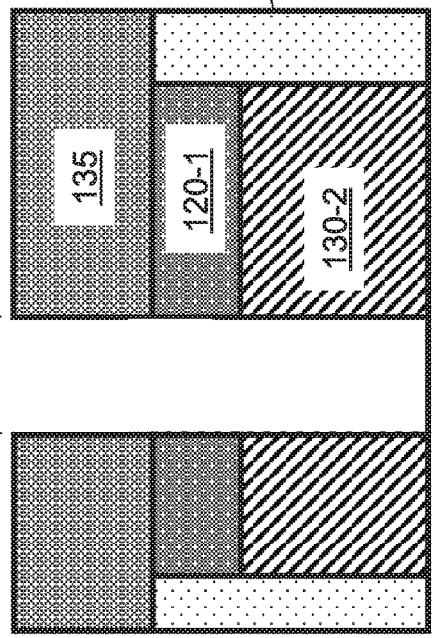
FIG. 6 is a cross-sectional view through the even conductive line of the device shown in FIG. 3, in accordance with an embodiment of the present invention.
Figure 5:
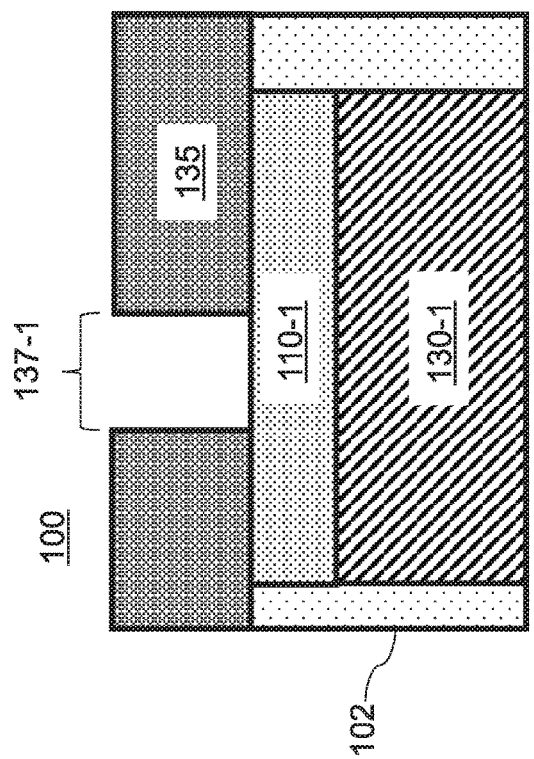
FIG. 5 is a cross-sectional view through the odd conductive line of the device shown in FIG. 3, in accordance with an embodiment of the present invention.

With reference to FIGS. 4-6, openings 137-1 and 137-2 and a cut region 150-2 corresponding to the even conductive line 130-2 are formed. For example, as shown in this illustrative example, the openings 137-1 and 137-2 can be formed by forming mask material 135, patterning the mask material 135 to the hardmasks 110-1 and 120-1, etching the hardmask 120-1 selective to the hardmask 110-1, and etching the even conductive line 130-2 to form a cut region 150-2. The mask material 135 can then be removed after the formation of the cut region 150-2.

Any suitable process can be used to form the openings 137-1 and 137-2 and the cut region 150-2 in accordance with the embodiments described herein. In one embodiment, reactive-ion etching (RIE) can be used. For example, selective RIE can be used to selectively etch the material of hardmask 120-1 (e.g. SiOx) with respect to the material of hardmask 110-1 (e.g. SiN).

The mask material 135 can include any suitable material in accordance with the embodiments described herein. In some embodiments, the mask material 135 can include multiple layers. For example, the mask material 135 can include an organic planarization layer (OPL), an antireflective coating layer (ARC) (e.g., SiARC layer) and a resist layer, which can form a trilayer lithography mask. As another example, the mask material 135 can include an OPL, a dielectric layer (e.g., oxide), a bottom ARC layer (BARC layer) and a resist layer, which can form a quad layer lithography mask The pattern in the mask material 135 can be formed using any suitable lithography process (e.g., deep UV or extreme UV lithography) with any suitable lithography stack (not shown).

Figure 7:
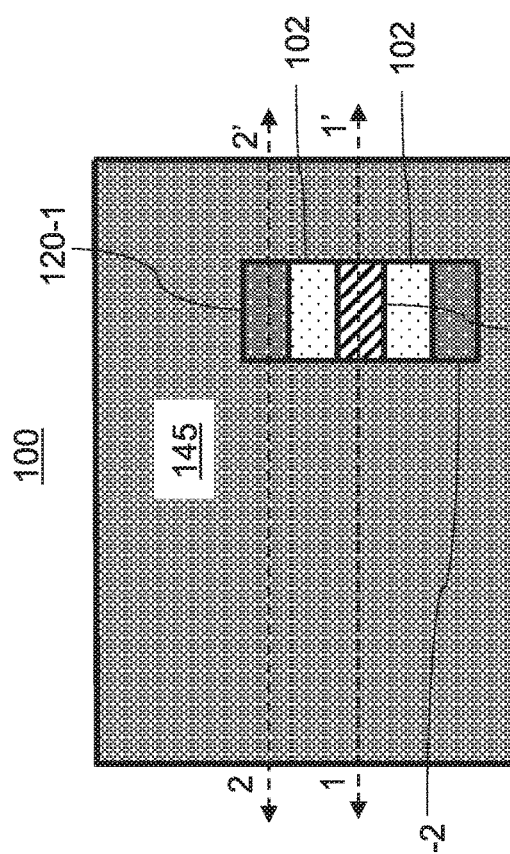
FIG. 7 is a top-down view of the formation of a second cut region corresponding to the odd conductive line during the fabrication of the semiconductor device, in accordance with an embodiment of the present invention.
Figure 9:
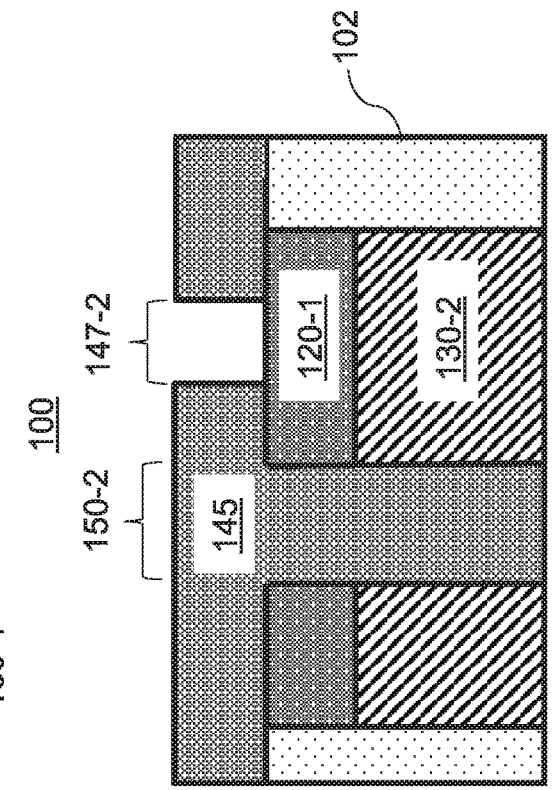
FIG. 9 is a cross-sectional view through the even conductive line of the device shown in FIG. 7, in accordance with an embodiment of the present invention.
Figure 8:
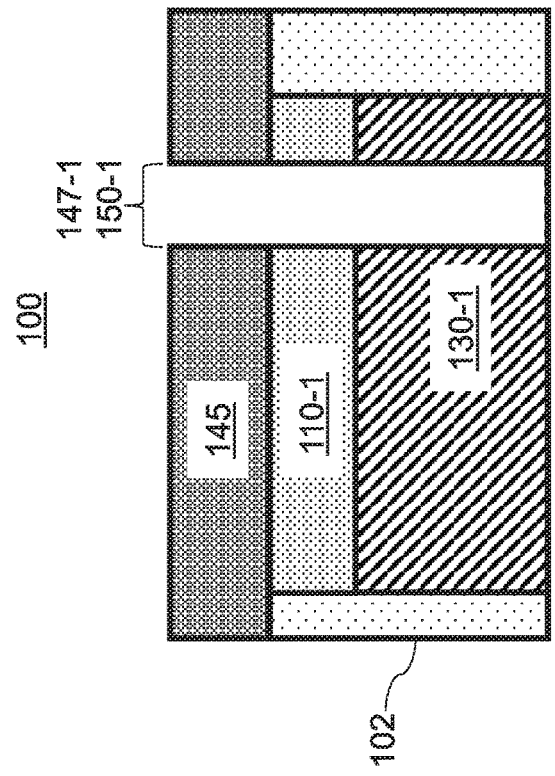
FIG. 8 is a cross-sectional view through the odd conductive line of the device shown in FIG. 7, in accordance with an embodiment of the present invention.

With reference to FIGS. 7-9, openings 147-1 and 147-2 and a cut region 150-1 corresponding to the odd conductive line 130-1 are formed. For example, as shown in this illustrative example, the openings 147-1 and 147-2 can be formed by forming mask material 145, patterning the mask material 145 to the hardmasks 110-1 and 120-1, etching the hardmask 110-1 selective to the hardmask 120-1, and etching the odd conductive line 130-1 to form the cut region 150-1. The mask material 135 can then be removed after the formation of the cut region 150-1.

Any suitable process can be used to form the openings 147-1 and 147-2 and the cut region 150-1 in accordance with the embodiments described herein. In one embodiment, RIE can be used. For example, selective RIE can be used to selectively etch the material of hardmask 120-1 (e.g. SiOx) with respect to the material of hardmask 110-1 (e.g. SiN).

The mask material 145 can include any suitable material in accordance with the embodiments described herein. In some embodiments, similar to the mask material 135, the mask material 145 can include multiple layers. For example, the mask material 435 can include an OPL, an ARC (e.g., SiARC layer) and a resist layer, which can form a trilayer lithography mask. As another example, the mask material 145 can include an OPL, a dielectric layer (e.g., oxide), a BARC layer and a resist layer, which can form a quad layer lithography mask The pattern in the mask material 145 can be formed using any suitable lithography process (e.g., deep UV or extreme UV lithography) with any suitable lithography stack (not shown).

Figure 10:
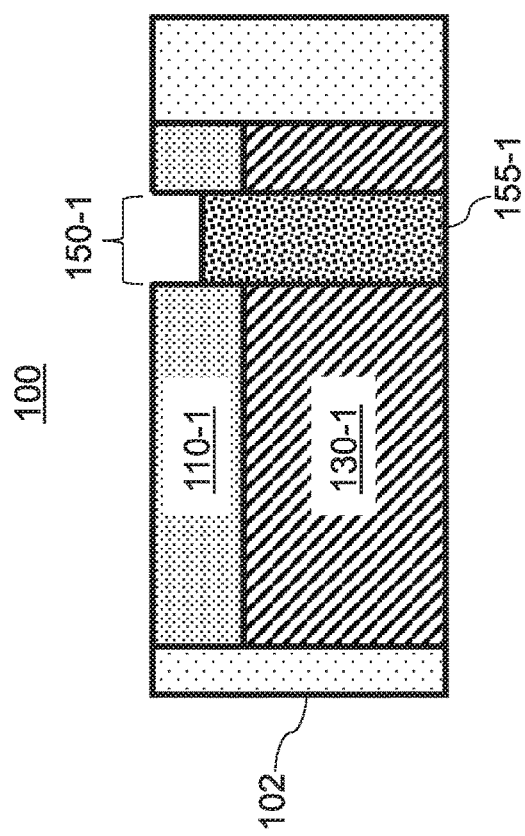
FIG. 10 is a cross-sectional view of the formation of sacrificial material within the first cut region, in accordance with an embodiment of the present invention.
Figure 11:
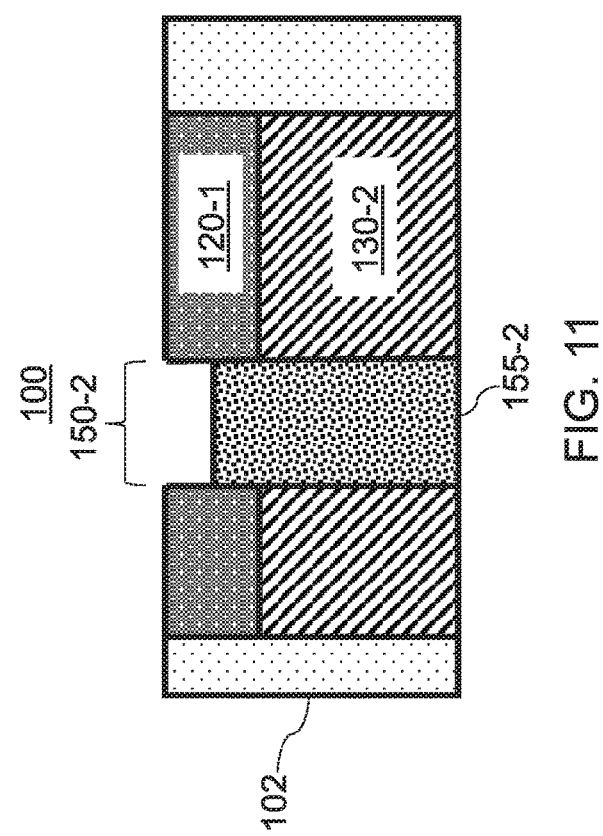
FIG. 11 is a cross-sectional view of the formation of sacrificial material within the second cut region, in accordance with an embodiment of the present invention.

With reference to FIG. 10, a cross-sectional view of the device 100 corresponding to the odd conductive line region is provided illustrating the formation of a sacrificial layer 155-1 within the cut region 150-1, and with reference to FIG. 11, a cross-sectional view of the device 100 corresponding to the even conductive line region is provided illustrating the formation of the sacrificial layer 155-2 within the cut region 150-2.

The sacrificial layers 155-1 and 155-2 can include any suitable material in accordance with the embodiments described herein. Examples of suitable materials that can be used to form the sacrificial layers 155-1 and 155-2 include, but are not limited to, a titanium nitride material (e.g., TiN), a titanium oxide material (e.g., $TiO_x$), an aluminum oxide material (e.g., $AlO_x$), an aluminum nitride material (e.g., AN), etc.

Any suitable process can be used to form the sacrificial layers 155-1 and 155-2 in accordance with the embodiments described herein. For example, the sacrificial layers 155-1 and 155-2 can be formed in the cut regions 150-1 and 150-2 by filling the cut regions 150-1 and 150-2 with sacrificial material, performing a planarization process (e.g., chemical-mechanical planarization (CMP)) and recessing the sacrificial material in the cut regions 150-1 and 150-2 to form the sacrificial layers 155-1 and 155-2. For example, if the sacrificial material includes a metal oxide, a chlorine-based etch chemistry can be used to etch the sacrificial material selective to the hardmasks 110-1 and 120-1 and the dielectric layers 102 (e.g., using RIE).

At this point, the dielectric layers 102 are replaced by replacement layers 103. Replacing the dielectric layers 102 with the replacement layers 103 can include removing the dielectric layers 102 using one or more etch processes, filling the void with replacement material, and planarizing (e.g., CMP) or etching back the replacement material to form the replacement layers 103. The replacement layers 103 can include any suitable material in accordance with the embodiments described herein. For example, the replacement layers 103 can include, e.g., an organic planarization layer (OPL) or other organic spin coated material.

With reference to FIGS. 12 and 13, the hardmasks 110-1 and 120-1 are recessed selective to the sacrificial layers 155-1 and 155-2, a conductive hardmask 160-1 is formed on the sacrificial layer 155-1 and the hardmask 110-1, and a conductive hardmask 160-2 is formed on the sacrificial layer 155-2 and the hardmask 110-2. More specifically, the conductive hardmasks 160-1 and 160-2 can be formed by selective deposition of conductive hardmask material. As shown in FIGS. 12 and 13, the conductive hardmasks 160-1 and 160-2 can be formed to have a semicircle or half-circle cross-sectional shape along the direction of the conductive lines 130-1 and 130-2. The conductive hardmasks 160-1 and 160-2 can include any suitable material in accordance with the embodiments described herein. Examples of suitable materials that can be used to form the conductive hardmasks 160-1 and 160-2 include, but are not limited to, titanium (Ti), tantalum (Ta), a titanium nitride material (e.g., TiN), a tantalum nitride material (e.g., TaN), etc.

Any suitable process can be used to recess the hardmasks 110-1 and 120-1 and form the conductive hardmasks 160-1 and 160-2 in accordance with the embodiments described herein. For example, the recessing of the hardmasks 110-1 and 120-1 can be performed using a timed RIE etch, a wet etch process, or a combination thereof that can etch hardmasks 110-1 and 120-1 selective to layers 103, 155-1 and 155-2. In one embodiment, a fluorocarbon-based RIE process can be used to recess the hardmasks 110-1 and 120-1.

Figure 14:
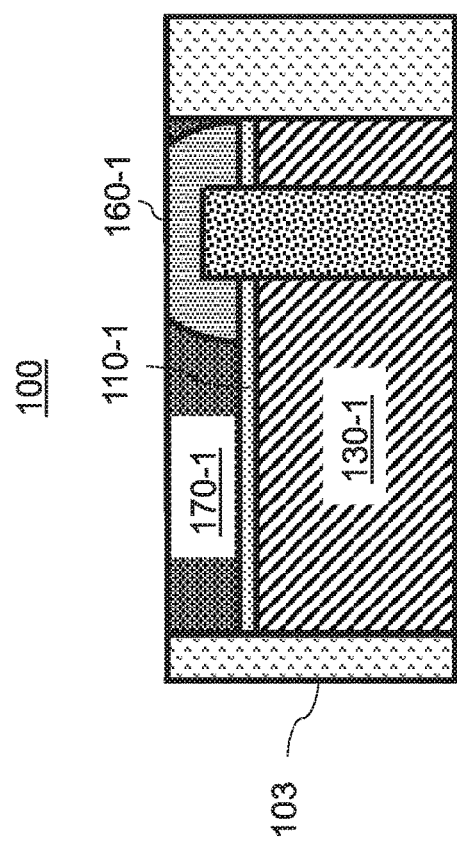
FIG. 14 is a cross-sectional view of hardmask fill and planarization within the odd conductive line region, in accordance with an embodiment of the present invention.
Figure 15:
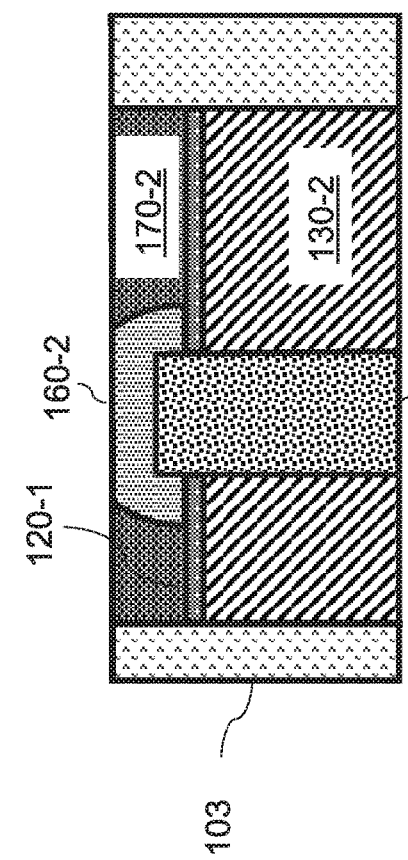
FIG. 15 is a cross-sectional view of hardmask fill and planarization within the even conductive line region, in accordance with an embodiment of the present invention.

With reference to FIGS. 14 and 15, additional hardmasks 170-1 and 170-2 are formed on hardmasks 110-1 and 120-1, respectively. In this illustrative embodiment, the additional hardmasks 170-1 and 170-2 can be formed by depositing additional hardmask material, and performing a planarization process (e.g., CMP). As can be seen in FIGS. 14 and 15, the planarization can result in the conductive hardmasks 160-1 and 160-2 having a flat upper surface.

Figure 16:
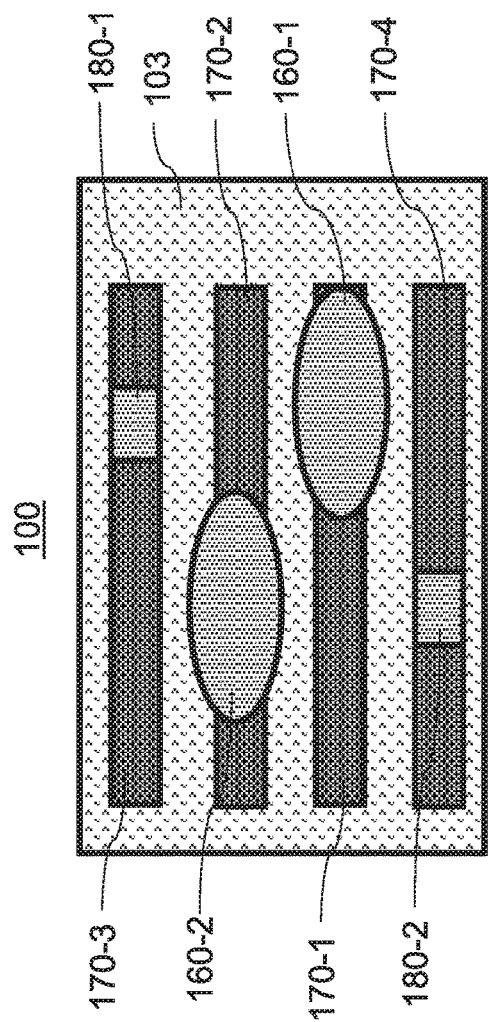
FIG. 16 is a top-down view of the formation of additional mask material on additional ones of the conductive lines during the fabrication of the semiconductor device, in accordance with an embodiment of the present invention.

With reference to FIG. 16, a top-down view is provided showing the formation of additional hardmasks 170-3 and 170-4 and additional conductive hardmasks 180-1 and 180-2, corresponding to the odd hardmask 110-2 and the even hardmask 120-2, respectively. The additional hardmasks 170-3 and 170-4 can include the same or different material as the additional hardmasks 170-1 and 170-2, and the additional conductive hardmasks 180-1 and 180-2 can include the same or different material as the additional conductive hardmasks 160-1 and 160-2.

Any suitable process can be used to form the additional hardmasks 170-3 and 170-4 and the additional conductive hardmasks 180-1 and 180-2 in accordance with the embodiments described herein. For example, non-line-end via patterning for the even hardmask 120-2 can be performed to form a mask, the even hardmask 120-2 can be etched to form an opening based on the mask, and the mask can be removed. Non-line-end via patterning for the odd hardmask 110-2 can be performed to form a mask, the odd hardmask 110-2 can be etched to form an opening based on the mask, and the mask can be removed. After the openings in the odd and even hardmasks 110-2 and 120-2 are formed, additional conductive hardmask material can be formed in the openings and a planarization process (e.g., CMP) can be performed.

Figure 17:
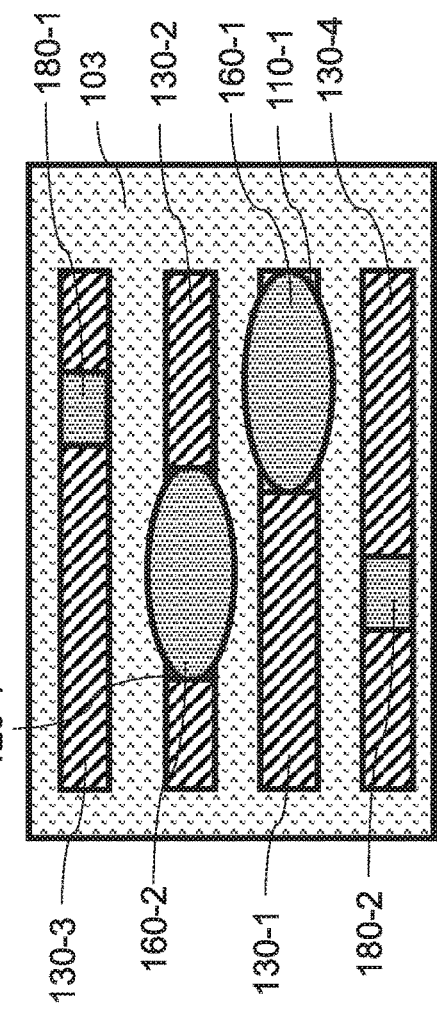
FIG. 17 is a top-down view of the removal of the hardmasks from the conductive lines during the fabrication of the semiconductor device, in accordance with an embodiment of the present invention.

With reference to FIG. 17, the additional hardmasks 170-1 through 170-4, the odd hardmasks 110-1 and 110-2, and the even hardmasks 120-1 and 120-2 are removed using any suitable etch process in accordance with the embodiments described herein. The removal of the material results in top via formation.

Figure 18:
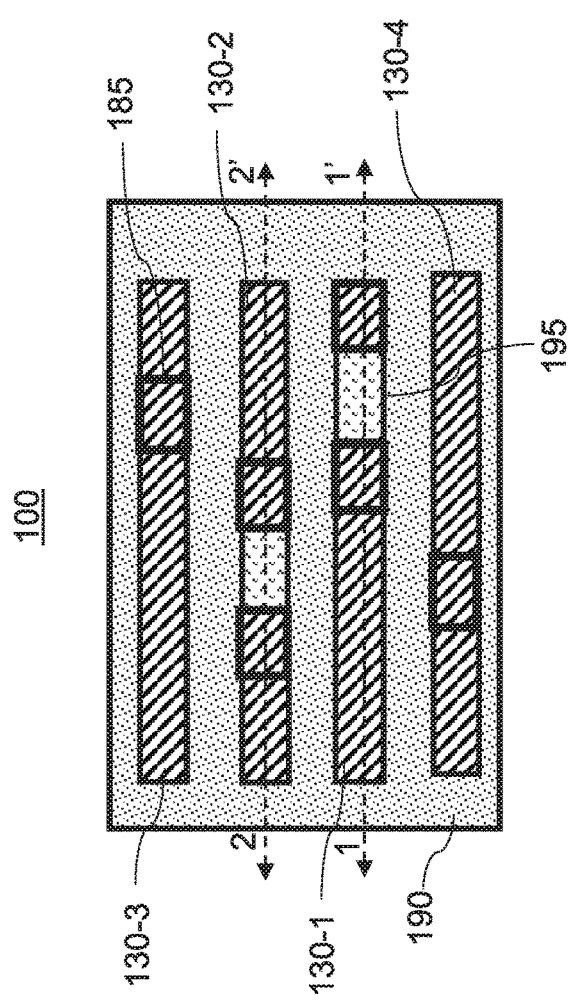
FIG. 18 is a top-down view of the removal of the sacrificial material from the cut regions and dielectric material fill during the fabrication of the semiconductor device, in accordance with an embodiment of the present invention.

With reference to FIG. 18, a top-down view of a semiconductor device 100 is provided illustrating the formation of self-aligned top vias 185, the removal of the replacement layers 103 and the sacrificial layers 155-1 and 155-2 and, and the formation of dielectric layers 190 and 195.

The top vias 185 are each formed at a line end corresponding a conductive line. For example, the top vias 185 can be formed by partially etching the conductive lines 130-1 and 130-2 using the hardmasks 160-1, 160-2, 180-1 and 180-2. Then, the replacement layer 103s can be removed using an etch process (e.g., RIE), the sacrificial layers 155-1 and 155-2 can be removed using another etch process (e.g., wet etch process), the dielectric layer 190 can be formed by depositing dielectric material and performing a planarization process (e.g., CMP), and the dielectric layer 195 can be formed by filling the space previously occupied by the sacrificial layers 155-1 and 155-2, and performing a planarization process (e.g., CMP).

The dielectric layers 190 and 195 can include any suitable material in accordance with the embodiments described herein. For example, the dielectric layer 190 can include a low-k or ULK dielectric material, and the dielectric layer 195 can include a "moderate-k", low-k or ULK dielectric material. As used herein, a moderate-k dielectric material refers to a dielectric material having a dielectric constant between about 4 to about 7. The dielectric layers 190 and 195 can include the same or different dielectric materials.

Figure 20:
FIG. 20 is a cross-sectional view through the even conductive line of the device shown in FIG. 18, in accordance with an embodiment of the present invention.
Figure 19:
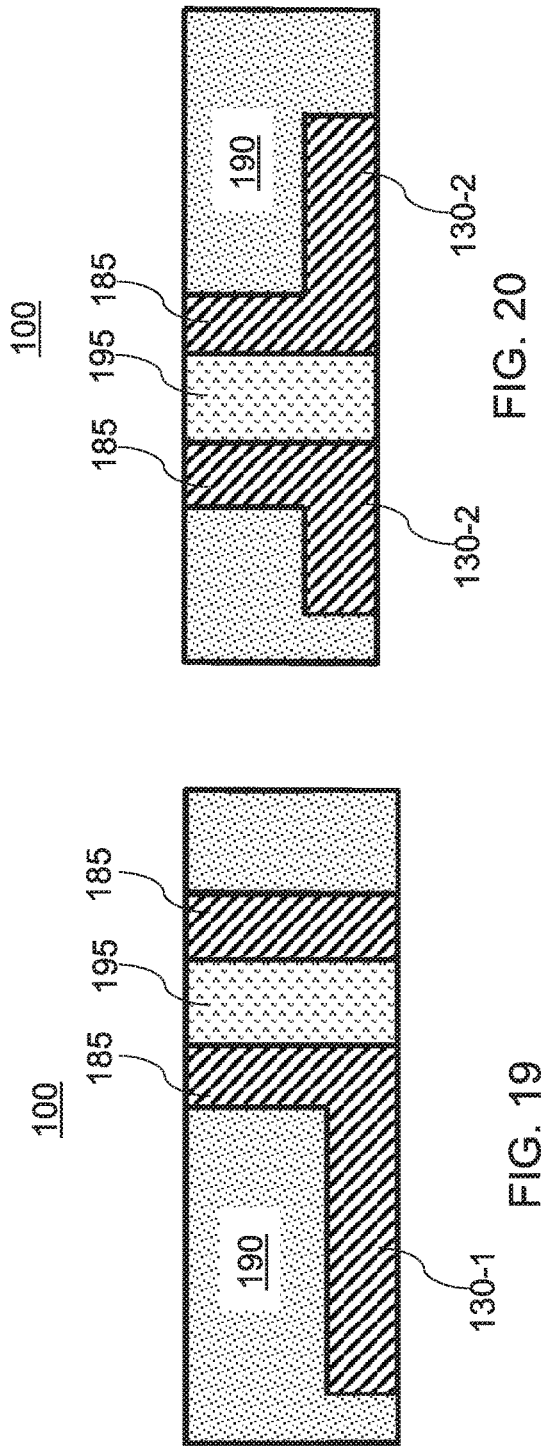
FIG. 19 is a cross-sectional view through the odd conductive line of the device shown in FIG. 18, in accordance with an embodiment of the present invention.

With reference to FIG. 19, a cross-sectional view of the device 100 through line 1-1' of FIG. 18 is provided corresponding to a cross-section through one of the odd conductive line regions, and with reference to FIG. 20, a cross-sectional view of the device 100 through line 2-2' of FIG. 18 is provided corresponding to a cross-section through one of the even conductive line regions.

Figure 21:
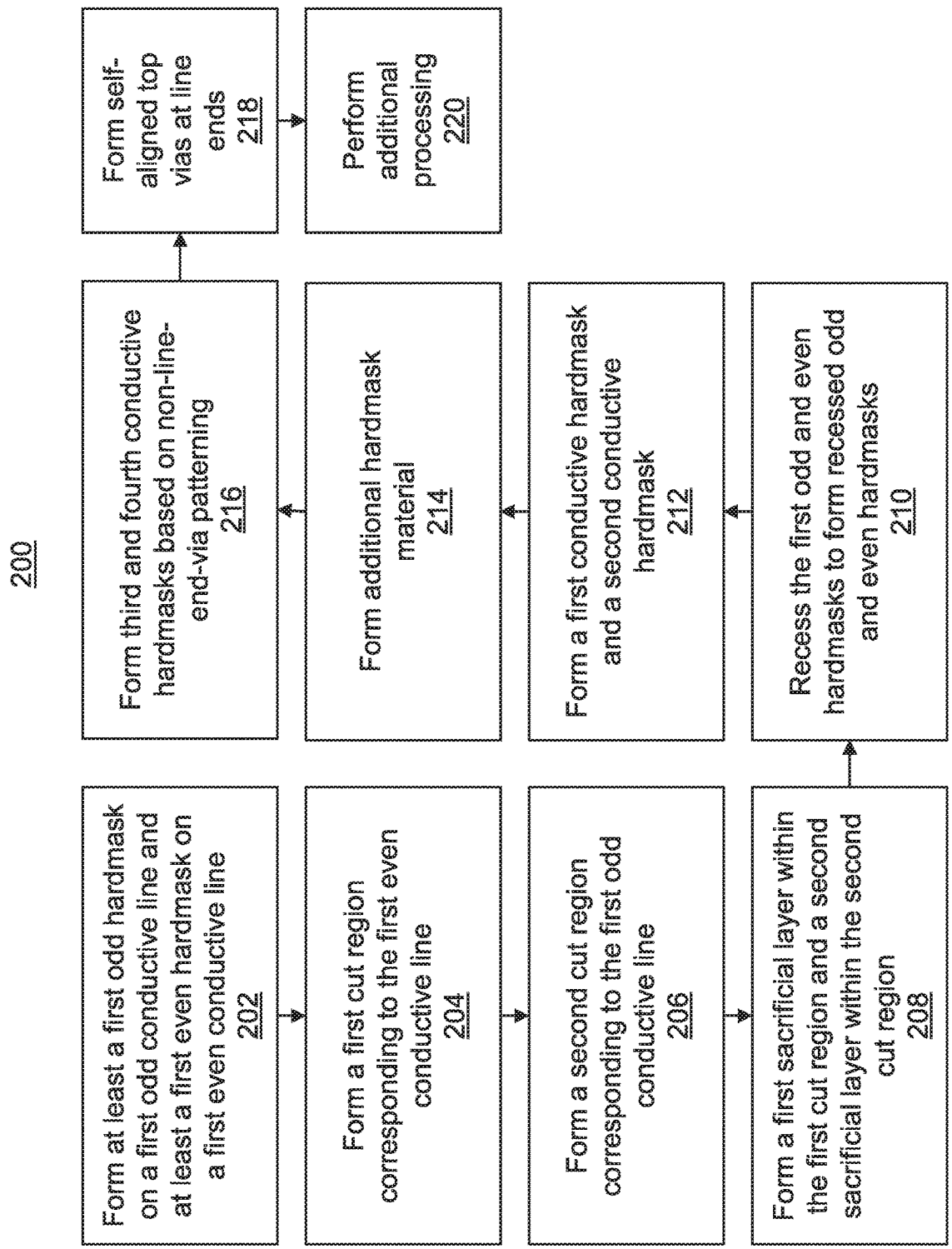
FIG. 21 is a block/flow diagram illustrating a system/method for fabricating a semiconductor device, in accordance with another embodiment of the present invention.

With reference to FIG. 21, a block/flow diagram is shown illustrating a system/method 200 for fabricating a semiconductor device, in accordance with an embodiment.

At block 202, at least a first odd hardmask is formed on a first odd conductive line, and at least a first even hardmask is formed on a first even conductive line. First dielectric layers can be formed on exposed sidewalls of the first odd and even hardmasks and first odd and even conductive lines.

The first odd hardmask can be formed to include a different material from the first even hardmask. More specifically, the material of the first odd and even hardmasks can be chosen to support a selective etch of the hardmasks during processing. Additionally, in an embodiment in which second odd and even hardmasks are formed on second odd and even conductive lines, respectively, the first and second odd hardmasks can be formed to include the same or different materials, and the first and second even hardmasks can be formed to include the same or different materials.

Examples of suitable materials used to form the odd hardmasks can include a silicon nitride material (e.g., SiN), a silicon carbide material (e.g., SiC), etc. Examples of suitable materials used to form the even hardmasks can include, but are not limited to, a silicon oxide material ($SiO_x$), a spin-on-glass (SOG) material, etc. However, the odd and even hardmasks can include any suitable materials in accordance with the embodiments described herein.

Examples of suitable conductive materials that can be used to form the odd and even conductive lines include, but are not limited to, copper (Cu), tungsten (W), ruthenium (Ru), cobalt (Co), aluminum (Al), etc.

Further details regarding block 202 are described above with reference to FIGS. 1-3.

At block 204, a first cut region corresponding to the first even conductive line is formed. Forming the first cut region can include forming first mask material on the first odd and even hardmasks, patterning the first mask material to the first odd and even hardmasks to form first odd and even openings, respectively, etching the first even hardmask selective to the first odd hardmask, and etching the first even conductive line through the first even opening to form the first cut region. The first mask material can then be removed.

Any suitable process can be used to form the first openings and the first cut region in accordance with the embodiments described herein. In one embodiment, reactive-ion etching (RIE) can be used. For example, selective RIE can be used to selectively etch the material of the first even hardmask (e.g. SiOx) with respect to the material of the first odd hardmask (e.g. SiN).

The first mask material can be formed to include any suitable material in accordance with the embodiments described herein. In some embodiments, the first mask material can be formed to include multiple layers. For example, the first mask material can be formed to include an organic planarization layer (OPL), an antireflective coating layer (ARC) (e.g., SiARC layer) and a resist layer, which can form a trilayer lithography mask. As another example, the first mask material can be formed to include an OPL, a dielectric layer (e.g., oxide), a bottom ARC layer (BARC layer) and a resist layer, which can form a quad layer lithography mask The pattern in the first mask material can be formed using any suitable lithography process (e.g., deep UV or extreme UV lithography) with any suitable lithography stack (not shown).

Further details regarding block 204 are described above with reference to FIGS. 4-6.

At block 206, a second cut region corresponding to the first odd conductive line is formed. Forming the second cut region can include forming second mask material on the first odd and even hardmasks, patterning the second mask material to the first odd and even hardmasks to form second odd and even openings, respectively, etching the first even hardmask selective to the first odd hardmask, and etching the first odd conductive line through the second odd opening to form the second cut region. The second mask material can then be removed.

Any suitable process can be used to form the second openings and the second cut region in accordance with the embodiments described herein. In one embodiment, RIE can be used. For example, selective RIE can be used to selectively etch the material of the first even hardmask (e.g. SiOx) with respect to the material of the first odd hardmask (e.g. SiN).

The second mask material can be formed to include any suitable material in accordance with the embodiments described herein. In some embodiments, similar to the first mask material, the second mask material can be formed to include multiple layers. For example, the second mask material can include an OPL, an ARC (e.g., SiARC layer) and a resist layer, which can form a trilayer lithography mask. As another example, the second mask material can include an OPL, a dielectric layer (e.g., oxide), a BARC layer and a resist layer, which can form a quad layer lithography mask The pattern in the second mask material can be formed using any suitable lithography process (e.g., deep UV or extreme UV lithography) with any suitable lithography stack (not shown).

Further details regarding block 206 are described above with reference to FIGS. 7-9.

At block 208, a first sacrificial layer is formed within the first cut region and a second sacrificial layer is formed within the second cut region. The sacrificial layers can be formed to include any suitable material in accordance with the embodiments described herein. Examples of suitable materials that can be used to form the sacrificial layers include, but are not limited to, a titanium nitride material (e.g., TiN), a titanium oxide material (e.g., $TiO_x$), an aluminum oxide material (e.g., $AlO_x$), an aluminum nitride material (e.g., AlN), etc.

Any suitable process can be used to form the sacrificial layers in accordance with the embodiments described herein. For example, the sacrificial layers can be formed in the cut regions by filling the cut regions with sacrificial material, performing a planarization process (e.g., chemical-mechanical planarization (CMP)) and recessing the sacrificial material in the cut regions to form the sacrificial layers. For example, if the sacrificial material includes a metal oxide, a chlorine-based etch chemistry can be used to etch the sacrificial material selective to the first odd and even hardmasks and the dielectric layers (e.g., using RIE).

Further details regarding block 208 are described above with reference to FIGS. 10 and 11.

At block 210, the first odd and even hardmasks are recessed to form recessed odd and even hardmasks. Any suitable process can be used to recess the first odd and even hardmasks in accordance with the embodiments described herein. For example, the first odd and even hardmasks can be recessed using a timed RIE etch, a wet etch process, or a combination thereof that can etch the first odd and even hardmasks selective to the dielectric layers and the sacrificial layers. In one embodiment, a fluorocarbon-based RIE process can be used to recess the first odd and even hardmasks.

At block 212, a first conductive hardmask and a second conductive hardmask are formed. The first conductive hardmask can be formed on the first sacrificial layer and the recessed odd hardmask, and the second conductive hardmask can be formed on the second sacrificial layer and the recessed even hardmask. More specifically, the first and second conductive hardmasks can be formed by selective deposition of a first conductive hardmask material.

The first and second conductive hardmasks can be formed to have a semicircle or half-circle cross-sectional shape along the direction of the first odd and even conductive lines. The first and second conductive hardmasks can include any suitable material in accordance with the embodiments described herein. Examples of suitable materials that can be used to form the first and second conductive hardmasks include, but are not limited to, titanium (Ti), tantalum (Ta), a titanium nitride material (e.g., TiN), a tantalum nitride material (e.g., TaN), etc. Any suitable process can be used to form the first and second conductive hardmasks in accordance with the embodiments described herein.

Forming the first and second conductive hardmasks can further include replacing the dielectric material with respective replacement layers. Replacing the dielectric material with the replacement layers can include removing the dielectric material using one or more etch processes, filling the void with replacement material, and planarizing (e.g., CMP) or etching back the replacement material to form the replacement layers. The replacement layers can include any suitable material in accordance with the embodiments described herein. For example, the replacement layers can include, e.g., an organic planarization layer (OPL) or other organic spin coated material.

Further details regarding blocks 210 and 212 are described above with reference to FIGS. 12 and 13.

At block 214, additional hardmask material is formed. Forming the additional hardmask material can include depositing the additional hardmask material on the recessed odd and even hardmasks and the first and second conductive hardmasks. Additionally, the additional hardmask material can be formed on the second odd and even hardmasks. A planarization process can then be performed (e.g., CMP). The planarization process can result in the first and second conductive hardmasks having a flat upper surface.

At block 216, third and fourth conductive hardmasks are formed based on non-line-end via patterning. More specifically, an opening to the second even conductive line can be formed through the additional hardmask material and the second even hardmask, an opening to the second odd conductive line can be formed through the additional hardmask material and the second odd hardmask, second conductive hardmask material can be formed within the openings in the second even and odd conductive lines, and a planarization process can be performed (e.g., CMP). Examples of suitable materials that can be used to form the third and fourth conductive hardmasks include, but are not limited to, titanium (Ti), tantalum (Ta), a titanium nitride material (e.g., TiN), a tantalum nitride material (e.g., TaN), etc. Any suitable process can be used to form the third and fourth conductive hardmasks in accordance with the embodiments described herein.

At block 218, self-aligned top vias are formed at line ends. The line ends correspond to the conductive lines (e.g., the first odd and even conductive lines). Any suitable process can be used to form the self-aligned top vias in accordance with the embodiments described herein. For example, forming the self-aligned top vias can include removing the odd and even hardmasks and the additional hardmask material, and partially etching the first odd and even conductive lines using the conductive hardmasks.

Further details regarding blocks 214-218 are described above with reference to FIGS. 14-17.

At block 220, additional processing is performed.

The additional processing can include removing the replacement layers and the sacrificial layers. The replacement layer can be removed using an etch process (e.g., RIE), and the sacrificial layers can be removed using another etch process (e.g., a wet etch process).

The additional processing can further include forming second dielectric layers in spaces between the odd and even conductive lines, and forming a third dielectric layers within spaces previously occupied by the replacement and sacrificial layers. More specifically, the second dielectric layer can be formed by depositing dielectric material and performing a planarization process (e.g., CMP), and the third dielectric layer can be formed by filling the space previously occupied by the replacement and sacrificial layers, and performing a planarization process (e.g., CMP).

Further details regarding block 220 are described above with reference to FIGS. 18-20.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   recessing a first odd hardmask and a first even hardmask to form recessed odd and even hardmasks, wherein the recessed odd and even hardmasks each have a top surface below a top surface of an adjacent replacement layer;
   forming a first conductive hardmask including a first conductive hardmask material on the recessed odd hardmask and a second conductive hardmask on the recessed even hardmask; and
   forming self-aligned top vias at line ends corresponding to first odd and even conductive lines based at least in part on the first and second conductive hardmasks.

2. The method of claim 1; wherein the first and second conductive hardmasks are formed to have a semicircle cross-sectional shape along a direction of the first odd and even conductive lines.

3. The method of claim 1, further comprising:
   forming an additional hardmask material on the recessed odd and even hardmasks and the first and second conductive hardmasks;
   performing a planarization process after forming the additional hardmask material; and
   forming third and fourth conductive hardmasks based on non-line-end via patterning after the planarization process.

4. The method of claim 3, wherein forming the third and fourth conductive hardmasks further includes:
   forming an opening to a second even conductive line through the additional hardmask material and a second even hardmask formed on the second even conductive line;
   forming an opening to a second odd conductive line through the additional hardmask material and a second odd hardmask formed on the second odd conductive line;
   forming a second conductive hardmask material within the openings to the second even and odd conductive lines; and
   performing a planarization process after forming the first and the second conductive hardmask material to form the third and fourth conductive hardmasks.

5. The method of claim 3, wherein forming the self-aligned top vias further includes:
   removing the recessed odd and even hardmasks and the additional hardmask material; and
   partially etching the first odd and even conductive lines using the third and fourth conductive hardmasks.

6. The method of claim 1, further comprising:
   forming the first odd hardmask on the first odd conductive line and the first even hardmask on the first even conductive line;
   forming first dielectric layers on sidewalls of the first odd and even hardmasks and the first odd and even conductive lines; and
   forming a first cut region corresponding to the first even conductive line and a second cut region corresponding to the first odd conductive line.

7. The method of claim 6, wherein the first odd hardmask is formed to include a different material from the first even hardmask to support a selective etch of the first odd and even hardmasks.

8. The method of claim 6, wherein forming the first cut region further includes:
   forming a first mask material on the first odd and even hardmasks;
   patterning the first mask material to the first odd and even hardmasks to form first odd and even openings, respectively;
   etching the first even hardmask selective to the first odd hardmask; and
   etching the first even conductive line through the first even opening to form the first cut region.

9. The method of claim 8, wherein forming the second cut region further includes:
   forming a second mask material on the first odd and even hardmasks and within the first cut region;
   patterning the second mask material to the first odd and even hardmasks to form second odd and even openings, respectively;
   etching the first even hardmask selective to the first odd hardmask; and
   etching the first odd conductive line through the second even opening to form the first cut region.

10. The method of claim 6, further comprising replacing the first dielectric layers with the replacement layer.

11. The method of claim 10, further comprising:
    forming a first sacrificial layer within the first cut region; and
    forming a second sacrificial layer within the second cut region.

12. The method of claim 11, further comprising performing additional processing, including:
    removing the first and second sacrificial layers to form openings between the self-aligned top vias;
    forming second dielectric layers in the openings; and
    replacing the replacement layers with third dielectric layers.

13. A method for fabricating a semiconductor device, comprising:
recessing a first odd hardmask and a first even hardmask to form recessed odd and even hardmasks, wherein the recessed odd and even hardmasks each have a top surface below a top surface of an adjacent replacement layer, and wherein the first odd hardmask is formed to include a different material from the first even hardmask to support a selective etch of the first odd and even hardmasks;
forming a first conductive hardmask including a first conductive hardmask material on the recessed odd hardmask and a second conductive hardmask on the recessed even hardmask, the first and second conductive hardmasks being formed to have a semicircle cross-sectional shape along a direction of first odd and first even conductive lines; and
forming self-aligned top vias at line ends corresponding to first odd and even conductive lines based at least in part on the first and second conductive hardmasks.

14. The method of claim 13, further comprising:
forming an additional hardmask material on the recessed odd and even hardmasks and the first and second conductive hardmasks;
performing a planarization process after forming the additional hardmask material; and
forming third and fourth conductive hardmasks based on non-line-end via patterning after the planarization process;
wherein forming the third and fourth conductive hardmasks further includes:
forming an opening to a second even conductive line through the additional hardmask material and a second even hardmask formed on the second even conductive line;
forming an opening to a second odd conductive line through the additional hardmask material and a second odd hardmask formed on the second odd conductive line;
forming a second conductive hardmask material within the openings to the second even and odd conductive lines; and
performing a planarization process after forming the first and second conductive hardmask material to form the third and fourth conductive hardmasks.

15. The method of claim 4; wherein forming the self-aligned top vias further includes:
removing the recessed odd and even hardmasks and the additional hardmask material; and
partially etching the first odd and even conductive lines using the third and fourth conductive hardmasks.

16. The method of claim 13, further comprising:
forming the first odd hardmask on the first odd conductive line and the first even hardmask on the first even conductive line;
forming first dielectric layers on sidewalls of the first odd and even hardmasks and the first odd and even conductive lines; and
forming a first cut region corresponding to the first even conductive line and a second cut region corresponding to the first odd conductive line;
wherein forming the first cut region further includes:
forming a first mask material on the first odd and even hardmasks;
patterning the first mask material to the first odd and even hardmasks to form first odd and even openings, respectively;
etching the first even hardmask selective to the first odd hardmask; and
etching the first even conductive line through the first even opening to form the first cut region; and
wherein forming the second cut region further includes:
forming a second mask material on the first odd and even hardmasks and within the first cut region;
patterning the second mask material to the first odd and even hardmasks to form second odd and even openings, respectively;
etching the first even hardmask selective to the first odd hardmask; and
etching the first odd conductive line through the second even opening to form the first cut region.

17. The method of claim 16, further comprising:
replacing the first dielectric layers with replacement layers;
forming a first sacrificial layer within the first cut region; and
forming a second sacrificial layer within the second cut region.

18. The method of claim 17, further comprising performing additional processing, including:
removing the first and second sacrificial layers to form openings between the self-aligned top vias;
forming second dielectric layers in the openings; and
replacing the replacement layers with third dielectric layers.

19. A method for fabricating a semiconductor device, comprising:
forming a first odd hardmask on a first odd conductive line and a first even hardmask on a first even conductive line, the first odd hardmask being formed to include a different material from the first even hardmask to support a selective etch of the first odd and even hardmasks;
forming first dielectric layers on sidewalls of the first odd and even hardmasks and the first odd and even conductive lines;
forming a first cut region corresponding to the first even conductive line and forming a second cut region corresponding to the first odd conductive line;
recessing the first odd hardmask and the first even hardmask to form recessed odd and even hardmasks;
replacing the first dielectric layers with respective replacement layers;
forming a first conductive hardmask including a first conductive hardmask material on the recessed odd hardmask and a second conductive hardmask on the recessed even hardmask, the first and second conductive hardmasks being formed to have a semicircle cross-sectional shape along a direction of the first odd and even conductive lines; and
forming self-aligned top vias at line ends corresponding to the first odd and even conductive lines based at least in part on the first and second conductive hardmasks.

20. The method of claim 19, further comprising:
forming additional hardmask material on the recessed odd and even hardmasks and the first and second conductive hardmasks;
performing a planarization process after forming the additional hardmask material; and
forming third and fourth conductive hardmasks based on non-line-end via patterning after the planarization process.

21. The method of claim 20; wherein:
forming the third and fourth conductive hardmasks further includes:
forming are opening to a second even conductive line through the additional hardmask material and a second even hardmask formed on the second even conductive line;
forming an opening to a second odd conductive line through the additional hardmask material and a second odd hardmask formed on the second odd conductive line;
forming a second conductive hardmask material within the openings to the second even and odd conductive lines; and
performing a planarization process after forming the first and second conductive hardmask material to form the third and fourth conductive hardmasks; and
forming the self-aligned top vias further includes:
removing the recessed odd and even hardmasks and the additional hardmask material; and
partially etching the first odd and even conductive lines using the third and fourth conductive hardmasks.

22. The method of claim 19, wherein:
forming the first cut region further includes:
forming a first mask material on the first odd and even hardmasks;
patterning the first mask material to the first odd and even hardmasks to form first odd and even openings, respectively;
etching the first even hardmask selective to the first odd hardmask; and
etching the first even conductive line through the first even opening to form the first cut region; and
forming the second cut region further includes:
forming a second mask material on the first odd and even hardmasks and within the first cut region;
patterning the second mask material to the first odd and even hardmasks to form second odd and even openings, respectively;
etching the first even hardmask selective to the first odd hardmask; and
etching the first odd conductive line through the second even opening to form the first cut region.

23. The method of claim 19, further comprising:
forming a first sacrificial layer within the first cut region;
forming a second sacrificial layer within the second cut region; and
performing additional processing, including:
removing the first and second sacrificial layers to form openings between the self-aligned top vias;
forming second dielectric layers in the openings; and
replacing the replacement layers with third dielectric layers.

24. A method for fabricating a semiconductor device, comprising:
forming a first odd hardmask on a first odd conductive line and a first even hardmask on a first even conductive line, the first odd hardmask being formed to include a different material from the first even hardmask to support a selective etch of the first odd and even hardmasks;
forming first dielectric layers on sidewalls of the first odd and even hardmasks and first odd and even conductive lines;
forming a first cut region corresponding to the first even conductive line and forming a second cut region corresponding to the first odd conductive line;
forming a first sacrificial layer within the first cut region and a second sacrificial layer within the second cut region;
recessing the first odd hardmask and the first even hardmask to form recessed odd and even hardmasks;
replacing the first dielectric layers with respective replacement layers;
forming a first conductive hardmask including a first conductive hardmask material on the recessed odd hardmask and a second conductive hardmask on the recessed even hardmask, the first and second conductive hardmasks being formed to have a semicircle cross-sectional shape along a direction of the first odd and even conductive lines;
forming additional hardmask material on the recessed odd and even hardmasks and the first and second conductive hardmasks;
performing a planarization process after forming the additional hardmask material;
forming third and fourth conductive hardmasks based on non-line-end via patterning after the planarization process;
forming self-aligned top vias at line ends corresponding to the first odd and even conductive lines based at least in part on the first and second conductive hardmasks; and
performing additional processing, including:
removing the first and second sacrificial layers to form openings between the self-aligned top vias;
forming second dielectric layers in the openings; and
replacing the replacement layers with third dielectric layers.

* * * * *